(12) United States Patent
Gu

(10) Patent No.: US 6,525,683 B1
(45) Date of Patent: Feb. 25, 2003

(54) NONLINEARLY CONVERTING A SIGNAL TO COMPENSATE FOR NON-UNIFORMITIES AND DEGRADATIONS IN A DISPLAY

(75) Inventor: Gong Gu, Bridgewater, NJ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/956,272

(22) Filed: Sep. 19, 2001

(51) Int. Cl.[7] ............................................. H03M 1/88
(52) U.S. Cl. ..................... 341/140; 341/138; 341/139; 341/144; 345/38; 345/39; 345/55; 345/90
(58) Field of Search .............................. 341/138, 139, 341/140, 144; 345/38, 39, 55, 90

(56) References Cited

U.S. PATENT DOCUMENTS

| | | | | |
|---|---|---|---|---|
| 5,694,146 A | * | 12/1997 | Ovshinsky et al. | 345/91 |
| 5,724,036 A | * | 3/1998 | Kobayashi et al. | 341/138 |
| 5,751,261 A | * | 5/1998 | Zavracky et al. | 345/55 |
| 5,751,279 A | * | 5/1998 | Okumura | 345/204 |
| 5,877,717 A | * | 3/1999 | Tu et al. | 341/150 |
| 5,929,827 A | * | 7/1999 | Isono et al. | 345/74 |
| 5,986,630 A | * | 11/1999 | Hirakata et al. | 345/90 |
| 6,184,855 B1 | * | 2/2001 | Kobayashi et al. | 345/100 |
| 6,339,417 B1 | * | 1/2002 | Quanrud | 345/98 |

* cited by examiner

Primary Examiner—Michael Tokar
Assistant Examiner—Khai Nguyen
(74) Attorney, Agent, or Firm—Trop, Pruner & Hu, P.C.

(57) ABSTRACT

A digital signal directed to a display (e.g., a plurality of display elements forming an array of display elements) may be converted into an analog signal using a nonlinear relationship. In one embodiment, a drive signal may be provided to at least one display element of the array of display elements in response to calibration data. Embedding the calibration data using the nonlinear relationship, the amplitude of the drive signal may be determined in order to control a perceptible output from the at least one display element of the array of display elements. Thus, a compensation for initial non-uniformity degradation over time, and/or non-uniform degradation may be provided to the at least one display element of the array of display elements. The nonlinear relationship reduces the number of discrete calibration data levels required to avoid perceptible contrast among neighboring pixels that leads to contouring effects. Optionally, a gamma correction may also be simultaneously provided with the compensation by adjusting the duration of the drive signal directed to the at least one display element of the array of display elements.

28 Claims, 9 Drawing Sheets

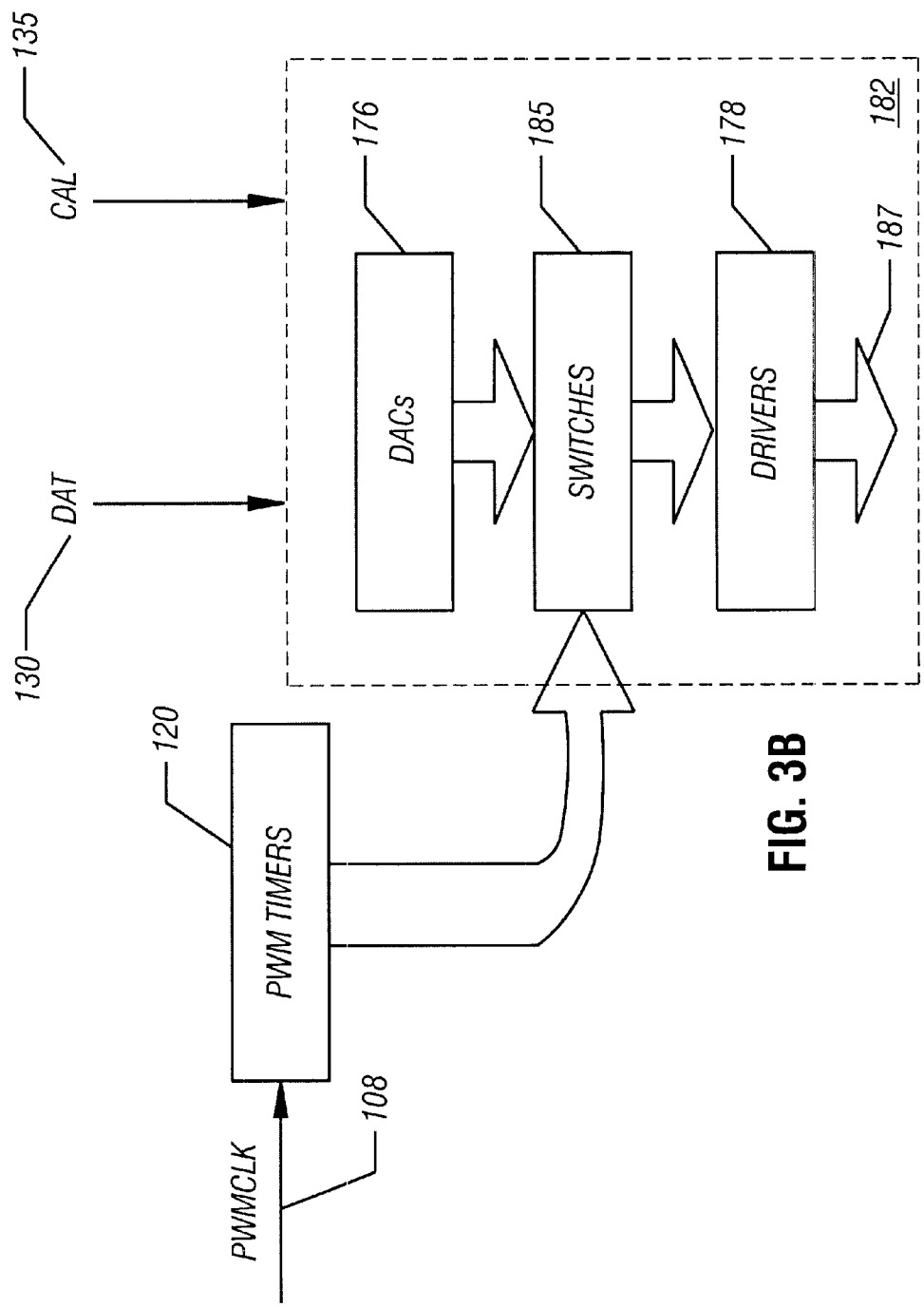

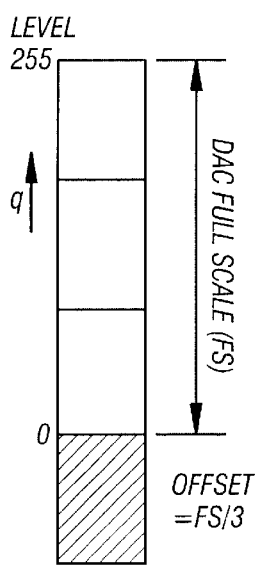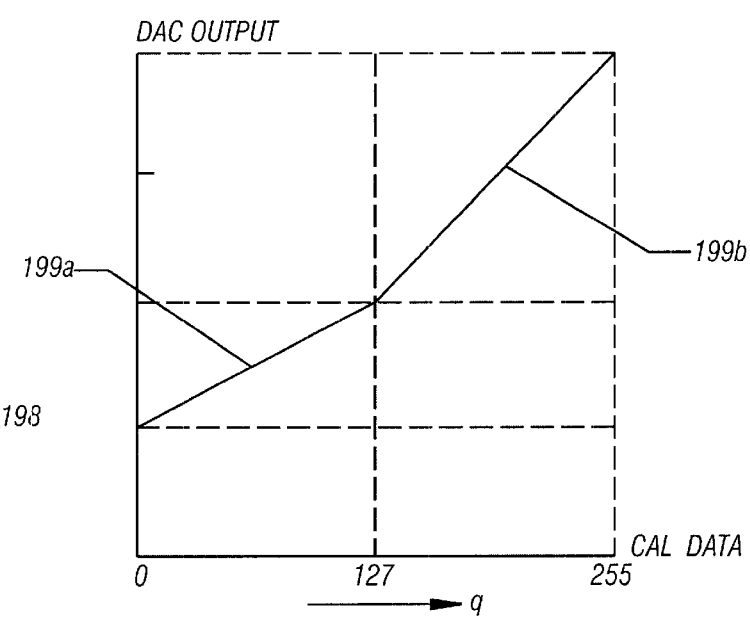
FIG. 4A
FIG. 4B

NONLINEARLY CONVERTING A SIGNAL TO COMPENSATE FOR NON-UNIFORMITIES AND DEGRADATIONS IN A DISPLAY

BACKGROUND

The invention generally relates to nonlinear signal conversion, and, more particularly, to nonlinearly converting a digital signal into an analog signal while using pulse width modulation (PWM) to compensate for degradations in a display element of a display through a driver, such as a column driver of passive matrix (PM) displays.

Pulse width modulation has been employed to drive PM displays. In the PWM scheme, gray level information is encoded in the pulse width of the subpixel driving signal, while the pulse amplitude is used for overall brightness control (i.e., dimming) and non-uniformity/aging compensation. In such a scheme, gray level control is decoupled from dimming and compensation, leading to simple column driver architectures. A PWM scheme may control displays, including emissive and non-emissive displays, which may generally comprise multiple display elements. Emissive displays may include light emitting diode displays, liquid crystal displays, and organic light emitting device (OLED) displays, as examples.

In one approach, only linear mapping of gray level to subpixel intensity has been implemented. In high quality video displays, however, nonlinear mapping (e.g., gamma correction) may be required because of the nature of human eye's nonlinear response. Namely, nonlinear compensation for the eye's nonlinear response is desired.

Typically, pulse width modulation (PWM) entails using a signal to encode information in a pulse by switching the signal on or off as required. For example, in a particular PWM scheme, the amplitude of the signal at a particular instance determines the width of the pulse. A PWM scheme may control displays, including emissive and non-emissive displays, which may generally comprise multiple display elements. Emissive displays may include light emitting diode displays, liquid crystal displays, and organic light emitting apparatus (OLED) displays, as examples. In order to control such displays, the current, voltage or any other physical parameter that may be driving the display element may be manipulated. When appropriately driven, these display elements, such as pixels, normally develop light that can be perceived by viewers.

More specifically, in an emissive display example, to drive a display (e.g., a display matrix having a set of pixels), electrical current is typically passed through selected pixels by applying a voltage to the corresponding rows and columns from drivers coupled to each row and column in some display architectures. An external controller circuit typically provides the necessary input power and data signal. The data signal is generally supplied to the column lines and synchronized to the scanning of the row lines. When a particular row is selected, the column lines determine which pixels are lit. An output in the form of an image is thus displayed on the display by successively scanning through all the rows in a frame.

In a variety of displays, certain degradations of display characteristics may be caused by extended usage of display elements, manufacturing defects, and/or lack of calibration of display elements. For instance, when driving the pixels of a display over a period of time, the brightness of the pixels may deteriorate at different rates. Additionally, pixel aging may adversely affect the performance of the display (e.g., by reducing brightness of the complete display or some particular display elements). In such a display, it is not uncommon to find pixel non-uniformity attributable to display manufacturing defects. Thus, in certain cases initial non-uniformity, degradation over time, and non-uniform degradation generally needs to be compensated.

The human eye responds to ratios of intensities, not absolute values of intensities. The human eye perceives the difference between 0.1 and 0.11 as the same as the difference between 0.9 and 0.99, for example. Such behavior of the human eye is generally known as the gamma characteristic. Pertaining to displays, a gamma characteristic is defined as the rate at which gray levels transition from white to black. How the human eye perceives gray level transitions has always been a problem, since the human eye perceives different gray levels in a nonlinear fashion. Lack of the perfect gamma correction also affects color hues in a color display. Thus, a gamma correction may be needed to adjust for different "whitenesses" of an image, which can create incorrect gray tones as perceived by the human eye. Similarly, since the eye is sensitive to relative contrasts, perceptible contrasts among the neighboring pixels will cause contouring effects and should be avoided. Hence, when discrete compensation is used, the fraction by which a compensation level increases from the immediately lower one should be smaller than a given value.

Unfortunately, conventional ways of driving displays using a typical PWM scheme may not be adequate. For example, conventional PWM schemes control display characteristics of particular display elements through width modulation or amplitude modulation to map video data to pixel brightness. Likewise, an appropriate compensation to overcome display distortions resulting from non-uniformity or aging of display elements may also be provided either by width modulation or amplitude modulation. However, it may be difficult to embed the gamma correction along with encoding display control and compensation-related information via simple, linear width modulation or amplitude modulation.

Thus, there is a need for better ways to controllably drive display elements in displays.

DESCRIPTION OF THE DRAWINGS

FIG. 3B is a block diagram of an alternate drive circuitry to generate a drive signal from both video and calibration data consistent with an alternate embodiment of the present invention;

FIG. 4A is a graph of a hypothetical output range of an output in accordance with one embodiment of the present invention implementing one embodiment of a digital-to-analog converter shown in FIG. 3A;

FIG. 4B is a graph of a hypothetical transfer function defining a nonlinear relationship between input data and corresponding magnitude of the output from the digital-to-analog converter shown in FIG. 3A.

DETAILED DESCRIPTION

In one embodiment, the present invention generally relates to a column driver architecture of passive matrix (PM) displays, and, more particularly, to the implementation of arbitrary nonlinear mapping of gray level to subpixel intensity using pulse width modulation (PWM), as well as the method of compensating against non-uniformity over the display and degradation over time using a digital-to-analog converter (DAC) of minimum resolution without causing contouring effects.

Figure 1A:
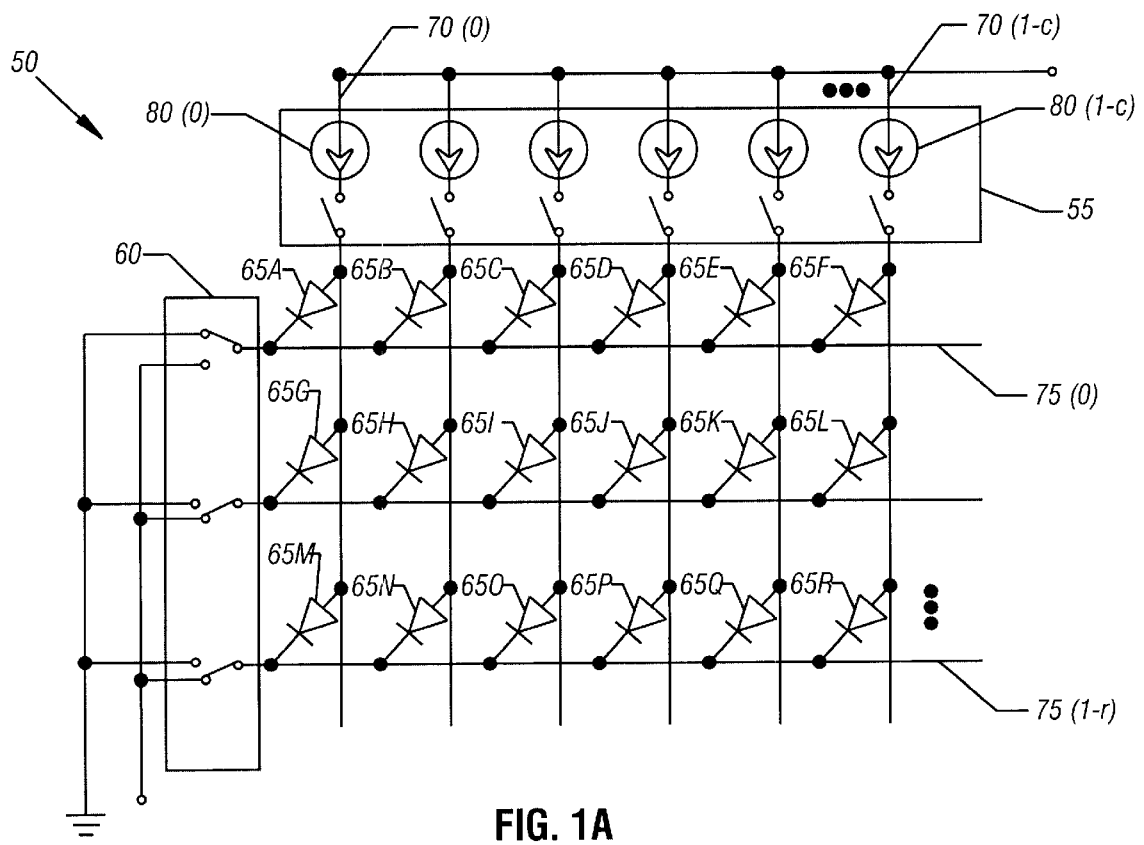
FIG. 1A is a schematic depiction of a display in accordance with one embodiment of the present invention.

One technique for embedding information to controllably drive a display 50 may use pulse width modulation (PWM) as shown in FIG. 1A. The display 50 is coupled to a column driver 55 and a row driver 60. The column driver 55 may receive data input and the row driver 60 may scan the array in a row-by-row manner. Of course, the display 50 may comprise any desired arrangement of one or more display elements. Examples of the display elements include emissive display elements, non-emissive display elements and current and/or voltage driven display elements.

In one embodiment, a plurality of pixels or subpixels 65A through 65R arranged in a matrix array comprise current driven light emitting diodes (LEDs). The display 50 may include a plurality of columns 70(0) through 70(1-c) and a plurality of rows 75(0) through 75(1-r). The column driver 55 may comprise a plurality of current sources 80(0) through 80(1-c) which may be provided to generate the driving current for the plurality of pixels 65A through 65R. Each column of the plurality of columns 70(0) through 70(1-c) may be coupled to a corresponding current source, for example. Alternatively, the plurality of current sources 80(0) through 80(1-c) may be configured in any other useful or desirable arrangement.

Typically, an image defaults to an imperfect gamma correction because of a linear calibration. Thus, a calibration for the gamma correction is often necessary to match the image with the characteristics of the plurality of pixels 65A through 65R. The linear calibration of the display 50 may not guarantee that a gamma-corrected image will match a particular display environment. In a color display, for instance, the gamma characteristic can have a major effect on the color hues of an image by changing the relative intensities of the red, green, and blue channels in a nonlinear fashion. If the images are not properly gamma corrected for the nonlinear relationship between a pixel display brightness and an actual displayed intensity perceived by the human eye, an image that looks good on one type of display may have the mid-tones too bright or too dark on a different display type, because of the difference in the displays' gamma characteristics.

Figure 1B:
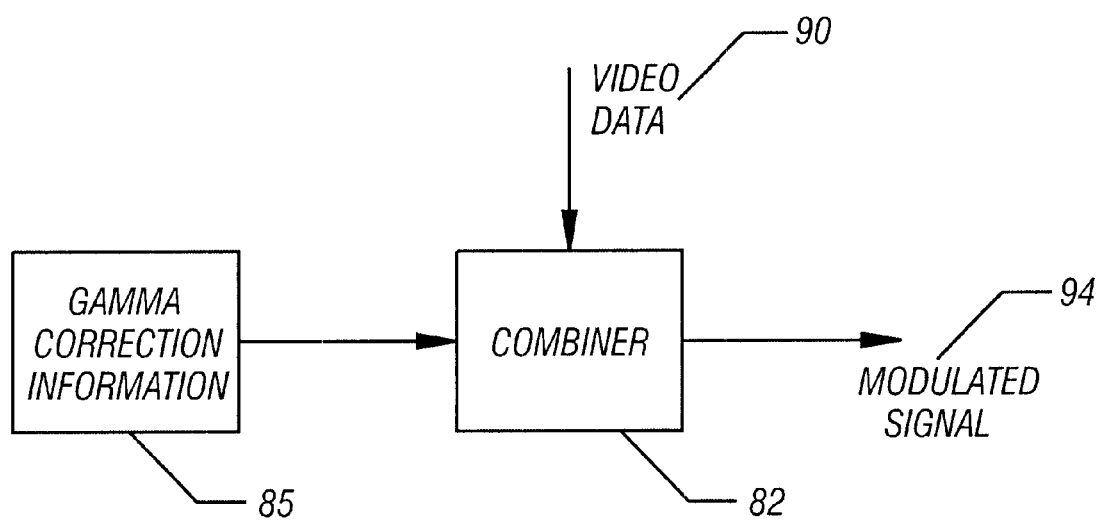
FIG. 1B is a block diagram of a system for gamma correction in accordance with one embodiment of the present invention.

As shown in FIG. 1B, a gamma correction may be provided to obviate a display nonlinearity of the plurality of pixels 65A through 65R of the display 50. For this purpose, a combiner 82 may receive gamma correction information 85 and video data 90. Using the gamma correction information 85 and the video data 90, the combiner 82 may provide a modulated signal 94, which may correct for the display nonlinearity of the plurality of pixels 65A through 65R.

The gamma correction information 85 may comprise predetermined timing information (e.g., the predetermined timing information may be retrieved from a look-up-table) for generating a series of pulses with each pulse separated from an adjacent pulse by a defined length. However, two defined lengths separating two pulses from an intermediate pulse may be of different lengths. Such series of pulses may comprise defined lengths as a function of a gamma correction desired for the display 50. In addition, the video data 90 to the combiner 82 may comprise gray level data associated with each pixel. The gray level data may be used to derive an indication for a number of defined lengths that may be used for each pixel to cause a gamma correction.

Using the gray level data and the series of pulses associated with each pixel, a number of defined lengths may be determined as a function of the gamma correction desired for a particular pixel of the plurality of pixels 65A through 65R. In the series of pulses, by measuring the interval between a first pulse and a selected pulse derived from the indication included in the gray level data associated with each pixel, the number of defined lengths for each pixel may be determined. By individually correlating the number of defined lengths to "ON" times for each of the plurality of pixels 65A through 65R, the plurality of pixels 65A through 65R may be controlled.

Since the "ON" time for each of the plurality of pixels 65A through 65R may be derived from the video data 90 (e.g., gray level data associated with each pixel) to generate the modulated signal 94, the brightness of each of the plurality of pixels 65A through 65R may be individually controlled. When applied, the modulated signal 94 may drive each of the plurality of pixels 65A through 65R according to the corresponding "ON" times. In this manner, the display nonlinearity of the plurality of pixels 65A through 65R may be corrected.

In one embodiment, the gamma correction information 85 for the display 50 may be calculated a priori, and can be advantageously combined with the video data 90, and optionally with calibration data. One technique to jointly provide a gamma correction for the display 50 includes decoupling individual brightness control of a pixel from overall brightness control and non-uniformity and/or aging compensation. However, once decoupled from the brightness control, the overall brightness control information and compensation information may be jointly embedded with the gamma correction information 85 in a pulse width modulation (PWM) scheme to generate the modulated signal 94, which controllably drives each of the plurality of pixels 65A through 65R of the display 50.

More particularly, the combiner 82 may generate a non-uniform pulse interval clock from a uniform pulse interval clock in response to the gamma correction information 85. Using the non-uniform pulse interval clock, the modulated signal 94 may controllably drive the plurality of pixels 65A through 65R. The duty cycle of the modulated signal 94 may be adjusted in response to the gamma correction information 85 while the magnitude of the modulated signal 94 may be optionally adjusted in response to the calibration data. Then the modulated signal 94 may be applied to the plurality of pixels 65A through 65R to control the individual brightness of the plurality of pixels 65A through 65R along with the overall brightness of the display 50, and to compensate for a degradation in display quality caused from the non-uniformity and/or aging of the plurality of pixels 65A through 65R.

Figure 2A:
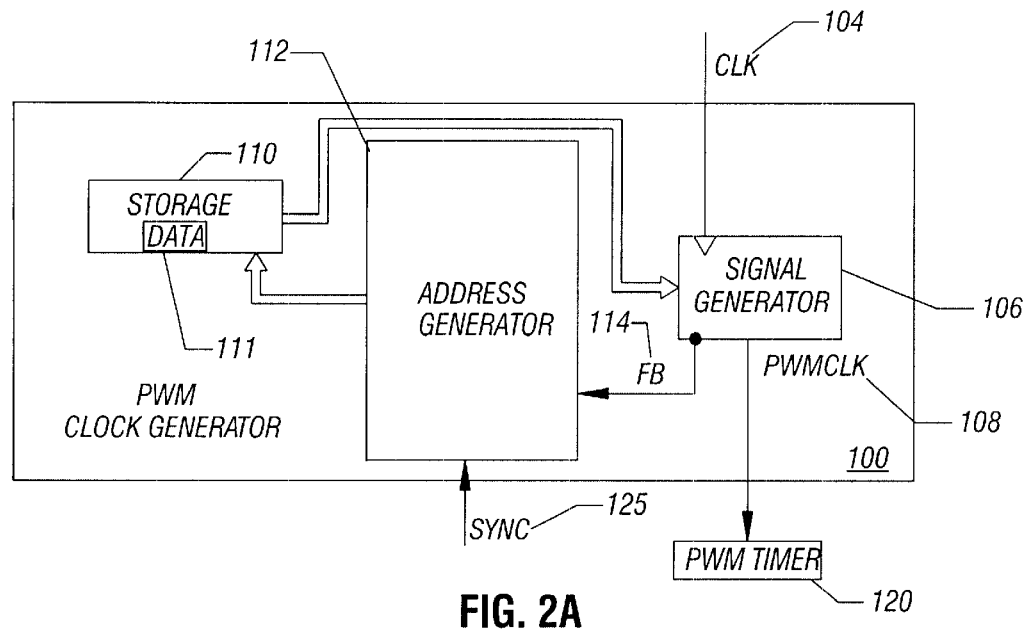
FIG. 2A is a block diagram of a non-uniform pulse interval PWM clock generator for use with a pulse width modulation (PWM) scheme according to one embodiment of the present invention.

A PWM clock generator 100 in FIG. 2A may be used with a pulse width modulation (PWM) scheme to controllably drive the display 50 while providing a gamma correction. The PWM clock generator 100 receives predetermined timing information associated with one or more pulse intervals in conjunction with a clock signal (CLK) 104 having a first series of pulses. The predetermined timing information may be representative of a gamma correction, for example. The PWM clock generator 100 further comprises a signal generator 106 coupled to an address generator 112 to encode the predetermined timing information in the first series of pulses for the purposes of generating a non-uniform pulse interval clock (PWMCLK) 108 having a second series of pulses. The PWM clock generator 100 further comprises storage 110 including data 111 (e.g., a look-up table to store the predetermined timing information having a predetermined value of pulse intervals).

When requested, the address generator 112 accesses the data 111 stored in the storage 110 for use with the CLK 104 in the signal generator 106. A feedback signal (FB) 114 may be provided from the signal generator 106 to the address generator 112, essentially controlling the flow of data 111 in one embodiment.

As shown in FIG. 2A, the PWM clock generator 100 provides the non-uniform pulse interval clock 108 for use with the PWM scheme. To this end, in the illustrated embodiment, a PWM timer 120 may be coupled to the PWM clock generator 100 to receive the non-uniform pulse interval clock 108 and the data 111 associated with at least one display element (e.g., a pixel of the plurality of pixels 65A through 65R) to control its "ON" time. For appropriate timing alignment with other associated circuitry, a synchronization signal "SYNC" 125 may be provided to the address generator 112 in one embodiment.

Figure 2B:
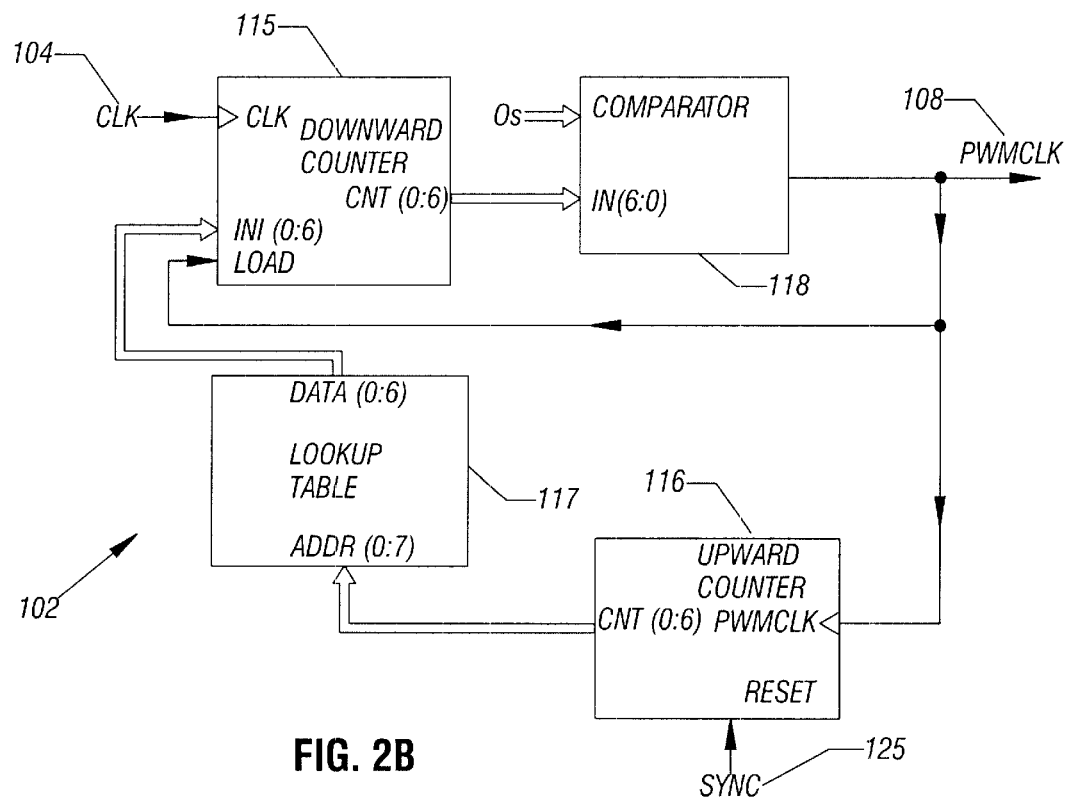
FIG. 2B is a block diagram of a non-uniform pulse interval PWM clock generator for use with a pulse width modulation (PWM) scheme according to another embodiment of the present invention.
Figure 2C:
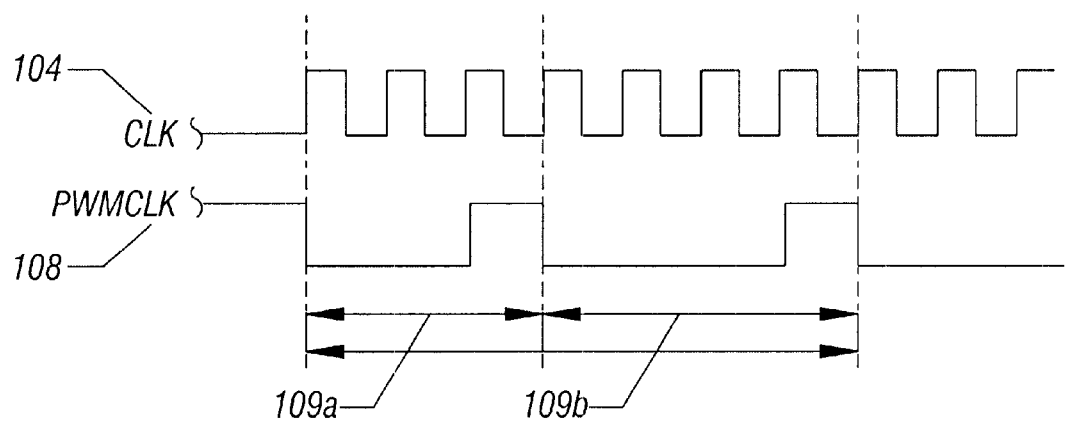
FIG. 2C is a graph of a hypothetical timing relationship for generating a non-uniform pulse interval clock in one embodiment of the present invention.

As shown in FIG. 2B, according to one embodiment of the presently contemplated alternate embodiments, a PWM clock generator 102 receives the CLK 104 in order to generate the PWMCLK 108. Of course, the PWM clock generator 102 may be implemented in one of many alternate ways, for example, using different configurations of one or more counters, storage elements and clock generation means. In the illustrated embodiment shown in FIG. 2, the PWM clock generator 102 comprises a downward counter 115 for receiving DATA(0:6) from a look-up table 117. In response to the PWMCLK 108 and the SYNC 125, an upward counter 116 generates a count signal CNT(0:6) to address a particular location through a particular address ADDR(0:7) in the lookup table 117. When enabled, for example, may be through a LOAD signal that is derived from the PWMCLK 18, the DATA(0:6) may be provided to the downward counter 115 through data INI(0:6). The data INI(0:6) may be received at a comparator 118 for the purposes of comparing the count IN(6:0) and the lookup table 117 data. Based on the outcome of the comparison, the comparator 118 thus generates the PWMCLK 108 in one embodiment.

The non-uniform pulse interval clock 108, shown in FIG. 2B, may be derived from both the clock signal 104 and the predetermined timing information in accordance with one embodiment of the present invention. The non-uniform pulse interval clock 108 may include a first pulse interval 109a between a first pair of adjacent pulses and at least one second pulse interval 109b between a second pair of adjacent pulses. The second pulse interval 109b may be different in length than the first pulse interval 109a.

In the embodiment shown in FIG. 2A, the storage 110 is addressed by the address generator 112 to provide the data 111 to the signal generator 106. The data 11 may include the predetermined timing information having first and second predetermined values for generating first and second pulse intervals 109a and 109b, respectively. Additionally, a counter may also be included in the signal generator 106 to count the second series of pulses within the non-uniform pulse interval clock 108.

Figure 3A:
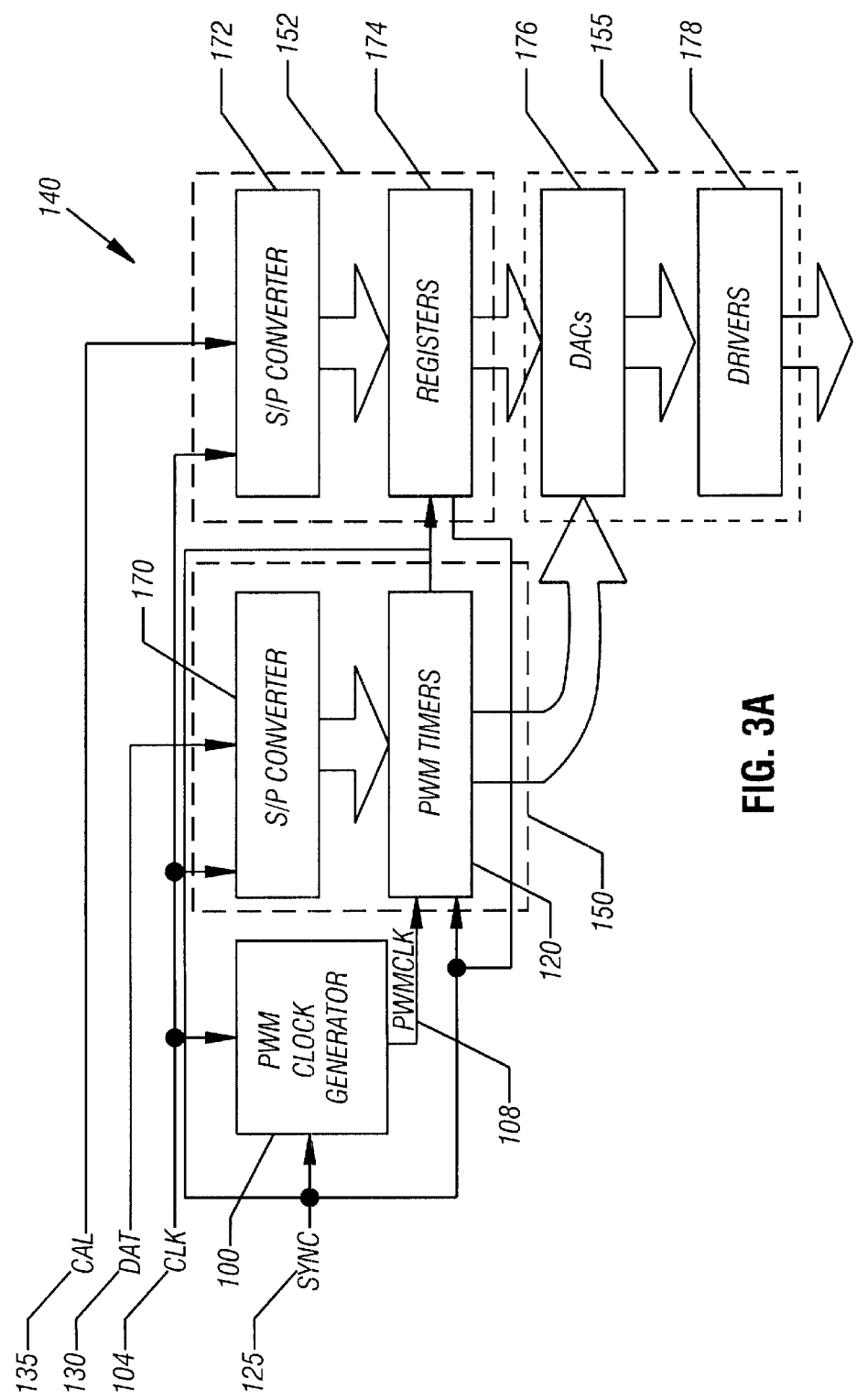
FIG. 3A is a block diagram of a column driver architecture in one embodiment of the invention, incorporating video data control circuitry, calibration data control circuitry, drive circuitry and pulse width modulation circuitry for use with the display shown in FIG. 1A.

In FIG. 3A, a column driver architecture 140 incorporates video data control circuitry 150, calibration data control circuitry 152, and drive circuitry 155 in accordance with one embodiment of the present invention. The column driver architecture 140 also includes the PWM clock generator 100 for providing the non-uniform pulse interval clock 108.

The video data control circuitry 150 may include a first serial-to-parallel (S/P) converter 170, which receives serial video data (DAT) 130. The serial video data 130 may be provided from any associated display circuitry. To use converted parallel video data 130, the first serial-to-parallel (S/P) converter 170 may be coupled to the PWM timer 120.

The calibration data control circuitry 152 may include a second serial-to-parallel (S/P) converter 172 in one embodiment, which receives serial calibration data (CAL) 135. The calibration data 135 may be provided from a look-up table having a plurality of registers. To store converted parallel calibration data 135, a plurality of registers 174 may be coupled to the second serial-to-parallel (S/P) converter 172. The drive circuitry 155 may comprise one or more digital-to-analog converters (DACs) 176, and one or more drivers 178.

In operation, the video data 130 (e.g., gray level data for individual and overall brightness control), and the calibration data (e.g., non-uniformity/aging compensation) 135, may be processed to operate drivers 178 at a data rate set by the clock signal 104 such as a data clock. But first, the serial video data 130 and serial calibration data 135 may be converted to parallel format by the first and second serial-to-parallel converters 170, 172 which may use shift registers for such conversion, in one embodiment. Then, the converted video data 130 may be fed from the first serial-to-parallel converter 170 to the PWM timer 120. The calibration data 135 may be fed from the second serial-to-parallel converter 172 to the registers 174. Finally, the DACs 176 may control both the magnitude and duration of the drive currents directed to the plurality of pixels 65A through 65R via the drivers 178.

The video data 130 including the gray level data may be mapped to "ON" times of the plurality of pixels 65A through 65R. Likewise, calibration data 135 may be used to adjust the magnitude of the drive current directed to the plurality of pixels 65A through 65R from the column driver 55. While the PWM clock generator 100 sets "ON" times for each pixel of the plurality of pixels 65A through 65R for controlling the individual pixel brightness associated with each pixel, the PWM timer 120 provides the "ON" times to the DACs 176, which in turn, control the duration of the drive currents being generated by the drivers 178.

The video data control circuitry 150 may use the non-uniform pulse interval clock 108 to control the individual pixel brightness for each pixel of the plurality-of pixels 65A through 65R. For example, the video data 130 associated with each pixel of the plurality of pixels 65A through 65R may be mapped to the individual pixel brightness by non-linearly setting an "ON" time for each pixel of the plurality of pixels 65A through 65R in response to the non-uniform pulse interval clock 108.

For each of the pixels 65A through 65R, the PWM timer 120 may determine the "ON" time by counting an associated number of the pulse intervals that may be included within the non-uniform pulse interval clock, 108. The PWM timer 120 may then turn off the corresponding pixel by resetting the corresponding DAC 176 output to 0. In this manner, a selective mapping of gray level data to the individual pixel brightness can be implemented with the internally generated non-uniform pulse interval clock 108. The pulse intervals required to generate the non-uniform pulse interval clock 108 may be determined from the look-up table contained in the storage 110, which may be advantageously located on a chip with the video data control circuitry 150 and the drive circuitry 155.

Both the first and second serial-to-parallel converters, 170 and 172, may share the clock signal 104 with the PWM clock generator 100. The synchronization signal "SYNC" 125 synchronizes both the PWM clock generator 100 and the PWM timer 120. For proper synchronization between the PWM clock generator 100, video data control circuitry 150 and the drive circuitry 155, the synchronization signal "SYNC" 125 controls the operation of the PWM timer 120 and the plurality of registers 174.

Accordingly, each individual pixel brightness level may be nonlinearly calibrated, such as logarithmically (rather than linearly) to provide for the gamma correction. Even though the calibration data 135 is converted linearly into the drive currents, or, alternatively voltages that drive the pixels 65A through 65R of the display 50, the calibration data 135 may produce an image having brightness proportional to a nonlinearly calibrated, individual pixel brightness levels from the predetermined timing information. Thus, a data value of half the maximum calibration value will not produce less than half the individual pixel brightness level, as the case in a non-gamma corrected image.

An alternate drive circuitry 182, shown in FIG. 3B, includes one or more switches 185 to generate a drive signal 187 from both the video and calibration data in an alternate embodiment of the present invention. In one embodiment, the drive signal 187 may comprise the drive currents, which controllably drive the pixels. By decoupling individual brightness control of a pixel from overall brightness control and non-uniformity or aging compensation, a gamma correction may be provided responsive to the predetermined timing information, as described earlier. In this case, for a combined provision of the gamma correction and the non-uniformity or aging compensation, the drive circuitry 182 may jointly generate the drive signal 187.

The PWM timers 120 may operate the switches 185 in response to the non-uniform pulse interval clock 108 to control durations of the drive currents directed to the pixels.

Thus, the video data 130 (e.g., gray level data associated with each pixel,) may be arbitrarily mapped to the individual brightness of each pixel. Additionally, the calibration data 135 may determine the magnitudes of the drive currents. In this way, the predetermined timing information concerning the gamma correction along with overall display control and compensation related information may be embedded in the PWM scheme using the non-uniform pulse interval clock 108 and the switches 185.

Figure 3C:
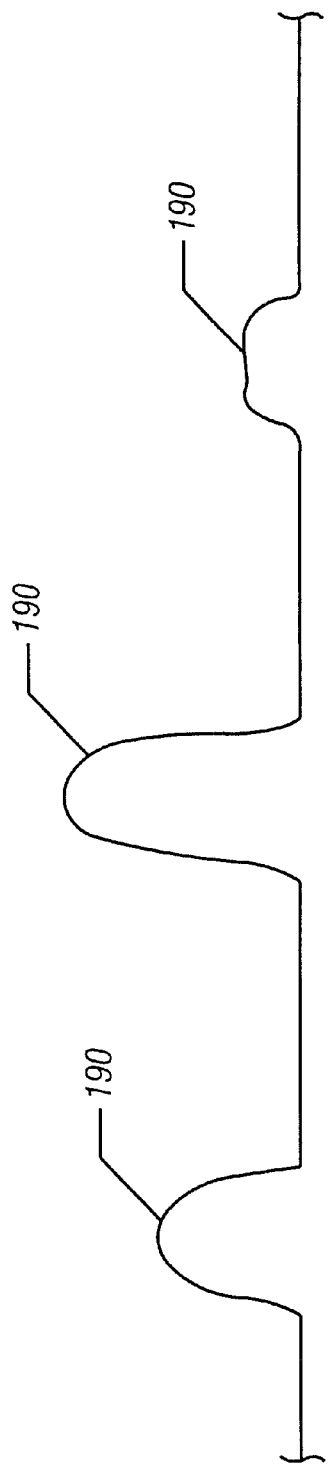
FIG. 3C is a graph of a hypothetical drive signal generated from the alternate drive circuitry shown in FIG. 3B according to one embodiment of the present invention.
Figure 3D:
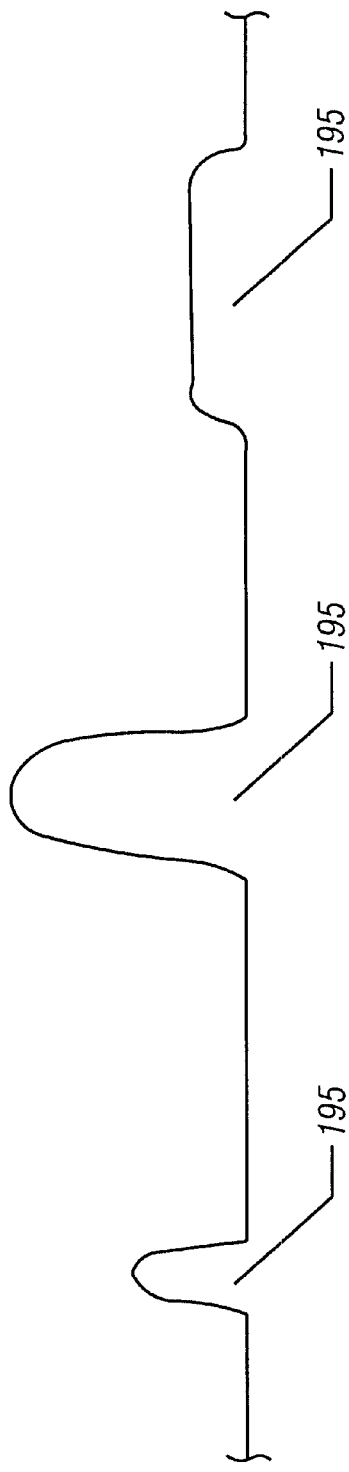
FIG. 3D is a graph of a hypothetical adjusted drive signal generated from the drive signal of FIG. 3C in response to a non-uniform pulse interval clock in one embodiment of the present invention.

As shown in FIG. 3C, adjusted magnitudes 190 of drive currents directed to each of the pixels of the plurality of pixels 65A through 65R may readily determine the overall brightness of the display 50 and may compensate for non-uniformity and aging degradation associated with the plurality of pixels 65A through 65R. As shown in FIG. 3D, adjusted durations 195 of the drive current directed to each of the pixels of the plurality of pixels 65A through 65R may readily determine the individual pixel brightness associated with each of the pixels of the plurality of pixels 65A through 65R to provide for a desired gamma correction.

In order to controllably adjust the drive current magnitudes 190, one or more human vision-related features may be advantageously incorporated within the DACs 176. More particularly, the human vision-related features may be mapped to the implementation-related features for the DACs 176 to appropriately operate the DACs 176 (FIGS. 3A and 3B). Using the implementation-related features, the magnitudes 190 (see FIG. 3C) of the drive currents directed to the plurality of pixels 65A through 65R may be determined according to the calibration data 135. In this way, a desired compensation from the calibration data 135 for overcoming non-uniformity and/or aging degradation may be provided to the plurality of pixels 65A through 65R using digital-to-analog converters (DACs) 176 coupled to the drivers 178 shown in FIG. 3A.

In one embodiment, for example, a set of two human vision-related features may be contemplated which can be readily correlated to an associated set of two implementation-related features for the DACs 176. The two human vision-related features may ensure that the DACs 176 may provide to each of the pixels of the plurality of pixels 65A through 65R an appropriate non-uniformity and/or aging compensation. Also, the two human vision-related features may avoid contouring effects, as in passive matrix displays, a display distortion caused by representing a continuous-tone image with an insufficient number of unique pixel luminance levels results in the contouring effect.

A first human vision-related feature encompasses defining a contrast ratio suitable for a display apparatus. Since a contrast ratio indicates the ratio of luminance levels between the brightest white and the darkest black for a particular display apparatus or a particular environment, a particular contrast ratio may be pre-selected accordingly. For example, the particular contrast ratio may define a range between a maximum value of brightness and a minimum value of brightness.

A second human vision-related feature includes determining how much compensation, if any, may be desired to overcome non-uniformity and/or aging degradation while maintaining the particular contrast ratio. To this end, a difference between compensation levels for adjacent pixels or subpixels of the plurality of pixels 65A through 65R may be calibrated against a predetermined fraction, in one embodiment. The compensation level may be a function of a compensation code having a number of bits, which may be derived from the calibration data 135. The predetermined fraction may be derived from an increment size for a compensation level. The increment size may be derived from a particular level of human vision adaptation, as typical human eye may only be able to differentiate between approximately one hundred-to-one contrast ratio of luminance levels ranging from white to black. Thus, within this range, the human eye could detect that two luminance levels are different only if the ratio between them exceeds about 1.01 (i.e., with an increment size of 0.01, a contrast sensitivity of 1% may be selected). As a result, the predetermined fraction may be selected to 1%.

To compensate over a one-hundred-to-one contrast ratio of luminance levels ranging from white to black, so as to produce non-human eye perceptible steps, it may be desired to represent luminance levels 1.00, 1.01, 1.02, and so on with an increment size of "0.01." This may ideally imply 10,000 unique luminance levels, requiring approximately fourteen bits ($2^{14}$=16,384) to include all the luminance levels within the calibration data 135. However, the human eye cannot detect a luminance difference between two pixels when the ratio of their luminance levels differs by less than approximately 1%. Thus, the human eye has a non-uniform perceptual response to luminance levels. Since the human eye responds to the ratios of luminance levels, not to an absolute increment between luminance levels, a significantly small number of luminance levels may be used according to the properties of the perception, thereby reducing the number of bits used to represent the perception-based luminance levels within the calibration data 135. For example, 10,000 unique linear luminance levels may be limited to two hundred fifty-six nonlinear luminance levels ($2^8$=256) in an 8-bit video system thus reducing the number of bits from fourteen to eight.

In accordance with the first human vision-related feature, a first implementation-related feature may be derived which relates to the selection of an adjustable output range for the DACs 176. To change the magnitude of a drive current directed to the compensated pixel or subpixel, it may be desirable to have the adjustable output range of the DACs 176 expressed as a ratio of a maximum drive current value to a minimum value drive current value where the ratio may be derived from the selected contrast ratio. Specifically, for a most affected pixel, a maximum level of drive signal desired to overcome non-uniformity and/or aging related degradation may be determined from the maximum value of brightness corresponding to the selected contrast ratio. In a similar fashion, for a least affected pixel, a minimum level of drive signal desired to overcome non-uniformity and/or aging related degradation may be established from the minimum value of brightness corresponding to the selected contrast ratio.

Likewise, as per the second human vision-related feature, in the case of a second-implementation related feature, it may be desirable to have an increment size for the drive current to a pixel determined relative to the drive current of an adjacent pixel. Advantageously, the increment size for the drive current to a pixel with regard to that of the immediately previous pixel may not be smaller than a predetermined fraction (e.g., approximately 1%).

Accordingly, in one embodiment, to compensate for such non-uniformity and/or aging degradation or for other reasons, digital-to-analog converters (DACs) 176 (see FIG. 3A) can be implemented in a manner using either a linear or nonlinear transfer function to map the calibration data 135 to pixel or subpixel drive current magnitudes 190 (see FIG. 3C). Optionally, each pixel or subpixel of the plurality of pixels 65A through 65R may use its own digital-to-analog converter, or, alternatively, the entire row or multiple pixels may share one digital-to-analog converter.

When using a linear digital-to-analog converter, any commercially available linear digital-to-analog converter using conversion methods similar to standard digital-to-analog conversion method which is capable of converting digital data into an analog format may be readily deployed. However, if linear digital-to-analog converters are used, a large number of bits may be needed if the desired adjustable output range is relatively large (e.g., a maximum to minimum ratio of 4:1 in this example) to satisfy the second human vision-related feature. Advantageously, however, a nonlinear digital-to-analog converter may be used to minimize the number of bits needed for the calibration data 135 to adjust the drive current magnitudes 190.

In one embodiment, a nonlinear digital-to-analog converter may be implemented, which satisfies both the adjustable output range and the output increment size corresponding to the two implementation-related features using a segmented transfer function with each segment being substantially linear. From the two human vision-related features, the segmented transfer function may define an adjustable output range and an output increment size for the DACs 176. In addition, a DAC offset in the DACs 176 in FIG. 3A can be introduced to match the minimum drive current value, which may represent a least amount of drive current used consistent with the 4:1 ratio.

Deriving an adjustable output range for an output of each of the digital-to-analog converters 176, and defining a transfer function having a nonlinear relationship between the calibration data 135 and corresponding magnitude of the output, the DACs 176 may be devised in accordance with one embodiment of the present invention. In particular, a transfer function and an architecture of such a digital-to-analog converter that meets both the adjustable output range and the output increment size features may have an offset substantially equal to one-third of a full scale (FS), leading to the maximum to minimum digital-to-analog converter output value ratio of 4:1, as shown in FIG. 4A.

To provide a finite amount of compensation to a pixel, a finite amount of an output value may be needed from DACs 176. Thus, while using the adjustable output range as a ratio of a maximum output value to a minimum output value (e.g., 4:1), the minimum value of the adjustable output range may be mapped as an offset 198 in DACs 176 with black at level "0," and white at level "255."

With increments between compensation levels of adjacent pixels less than approximately 1%, and with the desired width of n-bit of the calibration data 135 (e.g., 8-bit), a digital-to-analog converter may be readily devised having a nonlinear transfer function. The nonlinear transfer function, in one embodiment, may be approximated as a piecewise-segmented function including portions 199*a* and 199*b* shown in FIG. 4B. The DACs 176 may provide non-uniformity and/or aging compensation to one or more non-uniform and/or aged pixels through the nonlinear transfer function. As an example, in response to a first range of compensation codes, i.e., from 0 to 127 of the calibration data 135, the portion 199*a* having a first slope may determine the output for the DACs 176. The first slope may be a function of compensation levels desired for the one or more non-uniform and/or aged pixels within the range of 0 to 127 compensation codes. Likewise, in response to a second range of compensation codes, i.e., from 128 to 255 of the calibration data 135, the portion 199*b* having a second slope may determine the output for the DACs 176. The second slope (e.g., twice as that of the first slope) may be a function of compensation levels desired for the one or more non-uniform and/or aged pixels within the range of 128 to 255 compensation codes.

Figure 5:
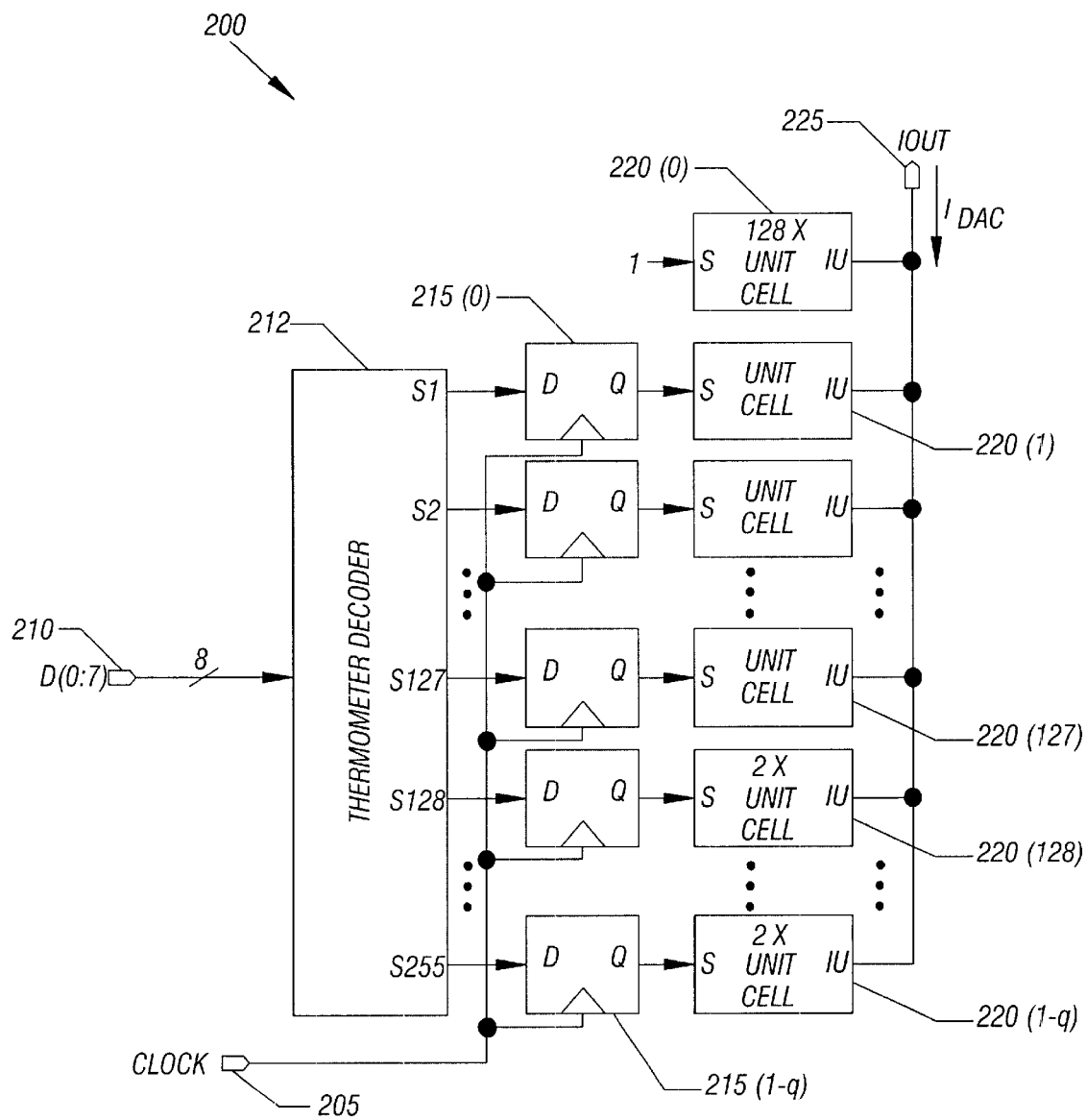
FIG. 5 is a block diagram of a driver for the display shown in FIG. 1A according to one embodiment of the present invention.

As shown in FIG. 5, a thermometer-code-based digital-to-analog architecture may be used for providing a driver (e.g., the column driver 55) for the display 50 shown in FIG. 1A according to one embodiment of the present invention. The thermometer-code-based digital-to-analog architecture may use a nonlinear digital-to-analog converter 200, implementing a nonlinear transfer function in accordance with one embodiment of the present invention. Of course, other architectures implementing a nonlinear digital-to-analog converter may be readily devised.

A clock signal (CLOCK) at a clock input 205 and an n-bit (e.g., 8-bit) wide digital signal derived as the compensation code from the calibration data 135 generally applied via digital inputs D(0:7) 210 may be received at a thermometer decoder 212. The thermometer decoder 212 converts the incoming digital inputs (e.g., bits) D(0:7) 210 into one or more selection signals S1 through S255 according to the thermometer code.

The nonlinear digital-to-analog converter 200 may further comprise a plurality of D flip-flops 215(0) through 215(1-$q$) each having an associated input and output in one embodiment. Each input of the plurality of D flip-flops. 215(0) through 215(1-$q$) is coupled to the thermometer decoder 212 for latching one or more of the corresponding decoded selection signals S1 through S255. Furthermore, the clock signal applied at the clock input 205 may be used to align the decoded selection outputs S1 through S255 with one another.

The nonlinear digital-to-analog converter 200 may further include a plurality of unit current source cells 220(0) through 220(1-$q$) each having an input and an output in one embodiment. Each output from the plurality of D flip-flops 215(0) through 215(1-$q$) may be operably coupled to a selected unit current source cell of the plurality of unit current source cells 220(0) through 220(1-$q$) to provide a selection signal "S." When selected, each unit current source cell 220 may output a corresponding unit current source cell current "$I_U$."

The state of the selection signal "S" may determine whether a specific unit current source cell 220 may sink a current, thus, decreasing the magnitude of the output current $I_{DAC}$ at the output terminal "$I_{OUT}$." For instance, when a particular selection signal "S" of a particular unit current source cell 220 is high (e.g. the state is "1"), then that particular unit current source cell 220 sinks a unit current "$I_U$." Conversely, another unit current source cell 220 sinks no current when an associated selection signal "S" is low (e.g. the sate is "0"). In this case, absent sinking of the current pertaining to the particular unit current source cell 220, the magnitude of the output current $I_{DAC}$ may not decrease at least as a result of that particular unit current source cell 220. However, in any event, the output current $I_{DAC}$ from the nonlinear digital-to-analog converter 200 may directly drive a pixel or subpixel, or, alternatively, may be used to control the drivers 178 shown in FIG. 3A.

To incorporate the offset 198 (FIG. 4A) in the nonlinear digital-to-analog converter 200, the unit current source cell 220(0) may be implemented to provide "128" times the unit current source cell current "$I_U$." As shown, in one embodiment, to cause the offset 198 (FIG. 4A), the selection signal "S" to the unit current source cell 220(0) may be permanently or programmably set to high (e.g. the state is "1"). Thus, the magnitude of a minimum output current for $I_{DAC}$ may be set accordingly. To match the first slope of the portion 199$a$ (FIG. 4B), the unit current source cells 220(1) through 220(127) may be devised as unit current source cells. When selected, each of the unit current source cells 220(1) through 220(127) may equally contribute the unit current source cell current "$I_U$." In a similar fashion, to match the second slope of the portion 199$b$ (FIG. 4B), the unit current source cells 220(128) through 220(1-$q$) may be devised as double unit current source cells. When selected, each of the unit current source cells 220(128) through 220(1-$q$) may equally contribute twice the unit current source cell current "$I_U$."

In operation, the thermometer decoder 212 provides one or more selection signals S1 through S255 according to the thermometer code to enable the selected unit current source cells 220 from the plurality of unit current source cells 220(0) through 220(1-$q$). All the unit current source cell currents "$I_U$" from the unit current source cells 220(0) through 220(1-$q$) may be summed to form an output current $I_{DAC}$ for the nonlinear digital-to-analog converter 200 at an output terminal "$I_{OUT}$" 225. The output current $I_{DAC}$ is an analog signal proportional to the n-bit wide digital signal (e.g., representative of the compensation code derived from the calibration data 135) applied via the digital inputs D(0:7) 210.

In one embodiment, the nonlinear digital-to-analog converter 200 sinks the output current $I_{DAC}$ governed by the following set of equations:

$$I_{DAC}=I_{OS}=qI_u, \ 0 \leq q \leq 127 \text{ or} \tag{1}$$

$$I_{DAC}=I_{OS}+127I_u+(q-127)\times 2I_u, \ 128 \leq q \leq 255, \tag{2}$$

where $I_{OS}$ is the offset, q is the compensation code, and $I_U=I_{OS}/128$ is the unit current source cell current. Thus, at q=0, the nonlinear digital-to-analog converter 200 output current is $$I_{DAC}^{(min)} = I_{OS} = 128 I_u, \tag{3}$$

while at q=255 the maximum nonlinear digital-to-analog converter 200 output current is $$I_{DAC}^{(max)} = (4 \times 128 - 1) I_u. \tag{4}$$

At any instance, the magnitude of the output current $I_{DAC}$ from the nonlinear digital-to-analog converter 200 (having the nonlinear transfer function, thus, saving the number of bits of the compensation code) may be determined by the state of the selection signals "S" of a particular unit current source cell 220. Since the selection signals "S" to the unit current source cells 220(0) through 220(1-$q$) are derived from the calibration data 135, the magnitudes 190 of the drive currents from the drivers 178 may be modulated based on the calibration data 135 at the expense of minimal number of bits of the compensation code as shown in FIG. 3A.

While the present invention has been described with respect to a limited number of embodiments, those skilled in the art will appreciate numerous modifications and variations. It is intended that the appended claims cover all such modifications and variations as fall within the true spirit and scope of the present invention.

What is claimed is:

1. A method, comprising:
   converting a digital signal directed to a plurality of display elements forming an array of display elements into an analog signal;
   digitally adjusting the magnitude of the analog signal based on a nonlinear relationship that forms a non-uniform pulse interval clock from a uniform pulse interval clock; and
   providing the analog signal to at least one display element of the array of display elements.

2. The method of claim 1, including modulating the magnitude of the analog signal to control a perceptible output from the at least one display element of the array of display elements.

3. A method comprising:
   converting a digital signal directed to a plurality of display elements forming an array of display elements into an analog signal using a nonlinear relationship;
   providing the analog signal to at least one display element of the array of display elements;
   modulating the magnitude of the analog signal to control a perceptible output from the at least one display element of the array of display elements; and
   defining an adjustable range to establish a minimum level of the magnitude and a maximum level of the magnitude for the analog signal, and an increment size to establish a minimum amount of adjustment applied to the analog signal while calibrating the magnitude of the analog signal.

4. The method of claim 3, including mapping the minimum level of the magnitude of the adjustable range to an offset in a transfer function defining said nonlinear relationship while modulating the magnitude of the analog signal.

5. The method of claim 4, including using the adjustable range as a ratio of a maximum level of compensation derived from calibration data to a minimum level of compensation derived from the calibration data to control the perceptible output from the at least one display element of the array of display elements.

6. The method of claim 3, including establishing the nonlinear relationship to perform a conversion of the digital signal into the analog signal, said nonlinear relationship obtained from one or more human-vision related features, wherein said adjustable range and the increment size is selected to conform with the one or more human-vision related features associated with the array of display elements.

7. A method comprising:
   converting a digital signal directed to a plurality of display elements forming an array of display elements into an analog signal using a nonlinear relationship;
   providing the analog signal to at least one display element of the array of display elements;
   modulating the magnitude of the analog signal to control a perceptible output from the at least one display element of the array of display elements;
   generating from timing information associated with the plurality of display elements forming the array of display elements, a first series of pulses having a first pulse interval between a first pair of adjacent pulses and at least one second pulse interval between a second pair of adjacent pulses, said first pulse interval being different than the at least one second pulse interval; and
   using the first series of pulses to generate a second series of pulses directed to the at least one display element of the array of display elements.

8. The method of claim 7, including receiving video data to determine the width of the second series of pulses in order to map the video data to the output intensity of the at least one display element of the array of display elements.

9. The method of claim 8, including receiving calibration data to:
   modulate the amplitude of the second series of pulses to control overall brightness of the array of display elements; and
   compensate for a perceptible degradation in the at least one display element of the array of display elements and a perceptible non-uniformity among the plurality of display elements.

10. The method of claim 8, further including adjusting a duration of illumination of the at least one display element of the array of display elements based on the width of the second series of pulses to map the video data to the perceptible output from the at least one display element of the array of display elements.

11. The method of claim 7, further including modulating the width of the second series of pulses for a gamma correction in the array of display elements while modulating the amplitude of the second series of pulses to calibrate the array of display elements.

12. A method comprising:
   converting a digital signal directed to a plurality of display elements forming an array of display elements into an analog signal using a nonlinear relationship;
   providing the analog signal to at least one display element of the array of display elements;
   modulating the magnitude of the analog signal to control a perceptible output from the at least one display element of the array of display elements; and
   using calibration data based on the nonlinear relationship in order to adjust the magnitude of the analog signal.

13. The method of claim 12, including modulating the magnitude of the analog signal in response to the calibration data to compensate for a perceptible degradation in the at least one display element of the array of display elements and a perceptible non-uniformity among the plurality of display elements.

14. The method of claim 13, including extracting an indication from the calibration data to determine a level of compensation to calibrate the perceptible output of the at least one display element of the array of the display elements.

15. The method of claim 14, including deriving from the calibration data said indication using a difference between first and second levels of compensation for adjacent display elements of the array of the display elements, said difference is compared to a predetermined fraction to determine whether to adjust the magnitude of the analog signal.

16. An apparatus, comprising:
   a signal converter to convert a digital signal directed to a plurality of display elements forming an array of display elements into an analog signal; and
   a combiner coupled to the signal converter to digitally adjust the magnitude of the analog signal based on a nonlinear relationship that forms a non-uniform pulse interval clock from a uniform pulse interval clock to provide the analog signal to at least one display element of the array of display elements.

17. The apparatus of claim 16, wherein the interface further comprises a driver coupled to the at least one display element of the array of display elements, said driver directs the analog signal to the at least one display element of the array of display elements.

18. The apparatus of claim 16, wherein the signal converter comprises a digital-to-analog converter.

19. An apparatus, comprising:
a signal converter to convert a digital signal directed to a plurality of display elements forming an array of display elements into an analog signal using a nonlinear relationship, wherein the digital-to-analog converter uses calibration data to determine the magnitude of the analog signal; and
an interface coupled to the signal converter to provide the analog signal to at least one display element of the array of display elements.

20. An apparatus comprising:
a signal converter to convert a digital signal directed to a plurality of display elements forming an array of display elements into an analog signal using a nonlinear relationship, wherein the signal converter defines an adjustable range to establish a minimum level of the magnitude and a maximum level of the magnitude for the analog signal, and an increment size to establish a minimum amount of adjustment applied to the analog signal while calibrating the magnitude of the analog signal; and
an interface coupled to the signal converter to provide the analog signal to at least one display element of the array of display elements.

21. The apparatus of claim 20, wherein the signal converter maps the minimum level of the magnitude of the adjustable range to an offset in a transfer function defining said nonlinear relationship while modulating the magnitude of the analog signal.

22. The apparatus of claim 21, wherein the signal converter uses the adjustable range as a ratio of a maximum level of compensation derived from calibration data to a minimum level of compensation derived from the calibration data to control the perceptible output from the at least one display element of the array of display elements.

23. An apparatus comprising:
a signal converter to convert a digital signal directed to a plurality of display elements forming an array of display elements into an analog signal using a nonlinear relationship;
an interface coupled to the signal converter to provide the analog signal to at least one display element of the array of display elements;
an address generator to provide timing information for said plurality of display elements;
a signal generator operably coupled to the address generator to receive said timing information to generate a first series of pulses having a first pulse interval between a first pair of adjacent pulses and at least one second pulse interval between a second pair of adjacent pulses, said first pulse interval being different than the at least one second pulse interval; and
a driver coupled to the signal generator, said driver to use the first series of pulses to generate a second series of pulses directed to the at least one display element of the array of display elements.

24. The apparatus of claim 22, wherein the signal generator receives video data to determine the width of the second series of pulses in order to map the video data to the output intensity of the at least one display element of the array of display elements.

25. The apparatus of claim 24, wherein the signal generator adjusts a duration of illumination of the at least one display element of the array of display elements based on the width of the second series of pulses to map the video data on the perceptible output from the at least one display element of the array of display elements.

26. The apparatus of claim 23, wherein the signal converter receives calibration data to determine the amplitude of the second series of pulses.

27. The apparatus of claim 26, wherein the signal converter uses the second series of pulses and the nonlinear relationship in order to adjust the magnitude of the analog signal.

28. The apparatus of claim 26, wherein the signal converter determines the magnitude of the analog signal in response to the calibration data to compensate for a perceptible degradation in the at least one display element of the array of display elements and a perceptible non-uniformity among the plurality of display elements.

* * * * *

UNITED STATES PATENT AND TRADEMARK OFFICE
CERTIFICATE OF CORRECTION

| | |
|---|---|
| PATENT NO. | : 6,525,683 B1 |
| APPLICATION NO. | : 09/956272 |
| DATED | : February 25, 2003 |
| INVENTOR(S) | : Gong Gu |

It is certified that error appears in the above-identified patent and that said Letters Patent is hereby corrected as shown below:

<u>Column 16</u>:
Line 18, "22" should be --23--.

Signed and Sealed this

Thirty-first Day of July, 2007

JON W. DUDAS
*Director of the United States Patent and Trademark Office*